United States Patent
Park

(10) Patent No.: US 8,119,443 B2
(45) Date of Patent: Feb. 21, 2012

(54) METHOD OF MANUFACTURING IMAGE SENSOR HAVING IONS IMPLANTED INTO PHOTODIODE LAYER TO CONTROL CONTACT HOLE SHAPE

(75) Inventor: Ji Hwan Park, Chungju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 120 days.

(21) Appl. No.: 12/501,784

(22) Filed: Jul. 13, 2009

(65) Prior Publication Data

US 2010/0015746 A1    Jan. 21, 2010

(30) Foreign Application Priority Data

Jul. 15, 2008  (KR) .................. 10-2008-0068532

(51) Int. Cl.
H01L 21/00     (2006.01)
H01L 21/30     (2006.01)
H01L 21/4763   (2006.01)
H01L 21/302    (2006.01)

(52) U.S. Cl. .......... 438/98; 438/458; 438/637; 438/685; 438/705; 257/E21.319

(58) Field of Classification Search .................... 438/98, 438/458, 637, 685, 705; 257/E21.319
See application file for complete search history.

(56) References Cited

U.S. PATENT DOCUMENTS

| | | | | |
|---|---|---|---|---|
| 5,350,484 A * | 9/1994 | Gardner et al. | ............... | 438/669 |
| 6,806,111 B1 * | 10/2004 | Ehrichs et al. | .................. | 438/29 |
| 7,049,241 B2 * | 5/2006 | Schroeder et al. | ............ | 438/705 |
| 2006/0125100 A1 * | 6/2006 | Arakawa | ...................... | 257/758 |
| 2007/0284692 A1 * | 12/2007 | Lee et al. | ...................... | 257/510 |
| 2010/0022088 A1 * | 1/2010 | Wallner et al. | ................ | 438/694 |

* cited by examiner

Primary Examiner — Kevin Parendo

(74) Attorney, Agent, or Firm — The Law Offices of Andrew D. Fortney; Andrew D. Fortney

(57) ABSTRACT

Provided is a method in which a photodiode layer is formed on a metal interconnection layer, and a hard mask layer is formed on the photodiode layer. Then, a photoresist pattern is formed on the hard mask layer to define a contact hole region, and a first hole is formed in the hard mask layer through an etching process. Next, an ion implantation etching layer is formed in the photodiode layer using the photoresist pattern as an ion implantation mask, and a second hole is formed by etching the ion implantation etching layer. A third hole is formed to expose the metal interconnection by etching a region of the metal interconnection layer corresponding to the second hole.

19 Claims, 4 Drawing Sheets

METHOD OF MANUFACTURING IMAGE SENSOR HAVING IONS IMPLANTED INTO PHOTODIODE LAYER TO CONTROL CONTACT HOLE SHAPE

CROSS-REFERENCE TO RELATED APPLICATIONS

The present application claims priority under 35 U.S.C. 119 and 35 U.S.C. 365 to Korean Patent Application No. 10-2008-0068532 (filed on Jul. 15, 2008), which is hereby incorporated by reference in its entirety.

BACKGROUND

An image sensor is a semiconductor device that converts an optical image into an electrical signal, and is largely classified into a Charge Coupled Device (CCD) and a Complementary Metal Oxide Silicon (CMOS) image sensor.

The CMOS image sensor is a device that employs a switching method for sequentially detecting an output of each unit pixel using a Metal-Oxide-Semiconductor (MOS) transistor. In the CMOS image sensor, MOS transistors corresponding to unit pixels are formed on a semiconductor substrate through a CMOS technique using a control circuit and a signal processing circuit as a peripheral circuit.

A semiconductor region of the CMOS image sensor is typically divided into a photodiode region and a transistor region. The photodiode region converts light into electrons. The transistor region constitutes a circuit for driving an output of a unit pixel of the image sensor.

For example, a method of forming a photodiode using a donor substrate will be described. First, a single crystal silicon substrate is used as a donor substrate, and then hydrogen ions may be implanted in the donor substrate with a predetermined depth or depth profile.

Second, the donor substrate is attached on a semiconductor substrate having a metal interconnection, and then is divided into two portions by a smart-cut method. At this point, the donor substrate is cut into two parts based on a layer where hydrogen ions are implanted. The attached portion (from the donor substrate) on the semiconductor substrate with the metal interconnection is used as a photodiode layer.

Third, a contact hole for connecting the metal interconnections is formed in the photodiode layer and a dielectric layer overlying the metal interconnection layer.

The photodiode layer is a layer where hydrogen ions are implanted, as mentioned above, and its ion distribution may vary according to the region or depth thereof. That is, a separation portion or region of the photodiode layer has the largest number of defects due to ion implantation in the photodiode layer. As it approaches toward a region adjacent to the metal interconnection layer, defects due to ion implantation decrease.

Due to a defect distribution difference, when an etching process is performed to form a contact hole, an etch rate of the photodiode layer may vary according to the depth. Therefore, since a tapered hole having a broad top and a narrow bottom is formed, when a subsequent tungsten deposition process is performed, a void may be formed, and tungsten may be partially removed during the subsequent etching and/or cleaning process. Therefore, the contact hole may not be completely filled.

This may deteriorate the operational reliability of the image sensor because it affects the flow of current to the metal interconnect.

SUMMARY

Embodiments provide a method of manufacturing an image sensor. The image sensor has a structure in which a photodiode layer from a single crystal semiconductor source (e.g., a substantially single crystal silicon photodiode layer) is formed on the uppermost portion after a metal interconnection layer is formed. The image sensor includes a contact hole of a predetermined size on or through a photodiode layer by overcoming an etch rate difference of the single crystal layer where ions are implanted in order to form a cutting plane.

In one embodiment, a method of manufacturing an image sensor comprises forming a photodiode layer on a metal interconnection layer having a metal interconnection therein; forming a hard mask layer on the photodiode layer and forming a photoresist pattern on the hard mask layer to define a contact hole region; forming a first hole in the hard mask layer through an etching process using the photoresist pattern as an etching mask; forming an ion implantation etching layer in the photodiode layer using the photoresist pattern and/or hard mask layer as an ion implantation mask; forming a second hole by etching the ion implantation etching layer; and forming a third hole to expose the metal interconnection by etching a region of the metal interconnection layer corresponding to the second hole.

The details of one or more embodiments are set forth in the accompanying drawings and the description below. Other features will be apparent from the description and drawings, and from the claims.

DETAILED DESCRIPTION OF THE EMBODIMENTS

An exemplary method of manufacturing an image sensor according to an exemplary embodiment will be described in detail with reference to the accompanying drawings.

Hereinafter, during description about an embodiment, detailed descriptions related to well-known functions or configurations will be ruled out in order not to obscure subject matters of the present invention. Thus, only core components, which are directly related to the technical aspects of the present invention, will be mentioned below.

In the description of various embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on,' 'in' and 'under' each layer may be made on the basis of the drawings.

Figure 1:
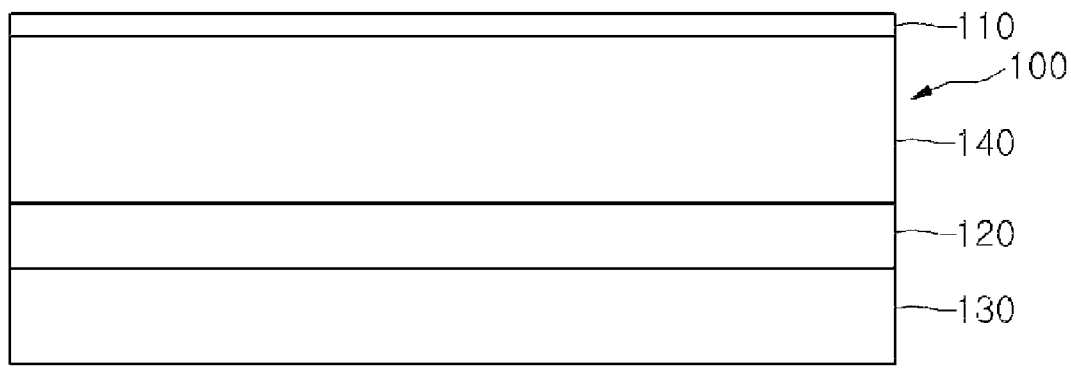
FIG. 1 is a cross-sectional view illustrating a form of a donor substrate after an ion implantation layer is formed according to an exemplary embodiment.

FIG. 1 is a cross-sectional view illustrating a form of a donor substrate 100 after an ion implantation layer 120 is formed according to an exemplary embodiment.

This embodiment is related to an image sensor having a structure in which a photodiode layer (e.g., a [substantially] single crystal layer) is formed on the uppermost portion or layer of the image sensor after a metal interconnection layer is formed. Accordingly, the single crystal layer to be used as the photodiode layer is additionally manufactured.

A first substrate 100 of FIG. 1 comprises a silicon crystal layer. Hereinafter, the first substrate 100 is called a donor substrate.

A sacrificial oxide layer 110 is formed on the donor substrate 100, for example in a bare wafer state. The sacrificial oxide layer 110 may be formed using a Rapid Thermal Oxidation (RTO) process, which may be wet or dry.

When an implantation process is performed later to form the ion implantation layer 120, the sacrificial oxide layer 110 reduces or prevents the incidence of lattice defects on the surface of the donor substrate 100.

Next, the ion implantation layer 120 is formed by implanting an ion (such as a hydrogen ion or other low molecular weight impurity) into the donor substrate 100. The ion implantation layer 120 is generally formed in (e.g., below the surface, or in the middle of) the donor substrate 100. A portion (e.g., comprising layer 140) above the ion implantation layer 120 in the donor substrate 100 is used as a photodiode layer according to the exemplary embodiment, and a portion (e.g., comprising layer 130) below the ion implantation layer 120 is subsequently removed (e.g., to provide a predetermined or standard thickness of the photodiode layer).

A position where the ion implantation layer 120 is formed can be changed by controlling injection energy (e.g., the energy of ion implantation) and injection amount or dose of hydrogen ions.

Figure 2:
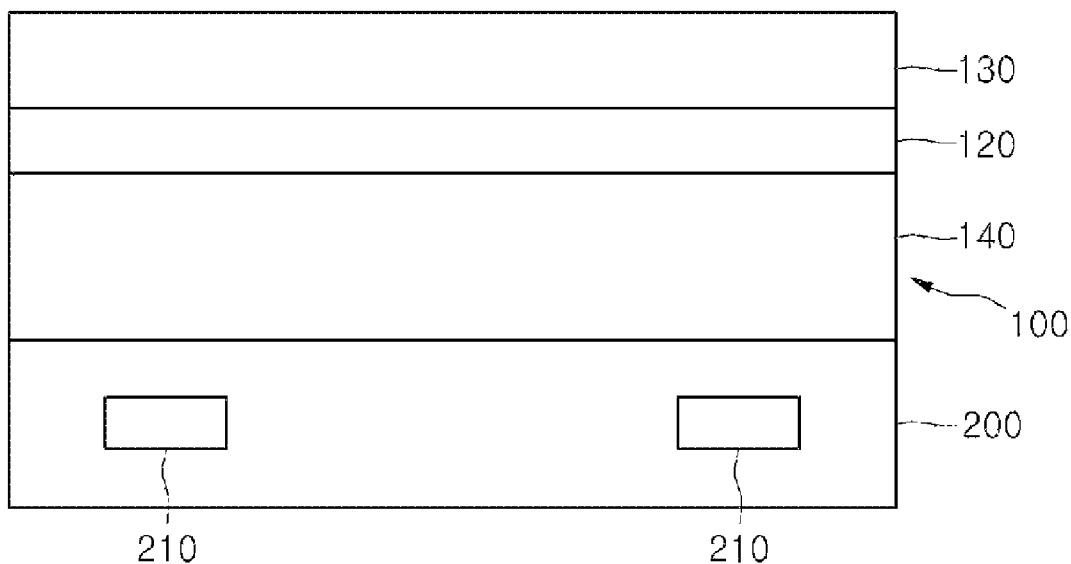
FIG. 2 is a cross-sectional view illustrating a form of an exemplary image sensor after the donor substrate is attached to a metal interconnection layer according to an exemplary embodiment.

FIG. 2 is a cross-sectional view illustrating a form of an exemplary image sensor after a donor 100 is attached to a metal interconnection layer 200 according to an exemplary embodiment.

Next, the sacrificial oxide layer 110 of the donor substrate 100 is removed through a planarization process (e.g., chemical mechanical polishing, or CMP) or an etching process (e.g., wet etching with dilute aqueous HF or buffered HF, or selective dry [plasma] etching using a fluorocarbon etchant). Then, the donor substrate 100 is reversed (e.g., flipped upside down relative to the orientation shown in FIG. 1) and attached to a second substrate 200.

The second substrate 200 is a substrate where an image sensor is substantially to be formed. The second substrate 200 may comprise $SiO_2$ or one or more insulator layers (at least one of which comprises $SiO_2$) and include a metal interconnection 210. Hereinafter, the second substrate 200 or the combination of insulator layer(s) and metal interconnections 210 is referred to as a metal interconnection layer. The donor substrate 100 is pressed and/or attached to the metal interconnection layer by applying a force of a predetermined pressure to the bottom of the donor substrate 100.

Figure 3:
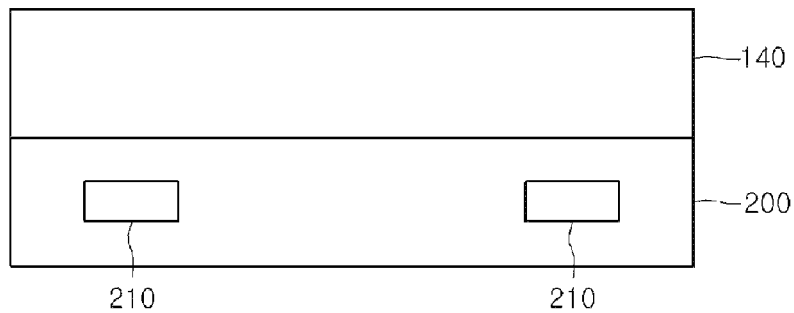
FIG. 3 is a cross-sectional view illustrating a form of an exemplary image sensor after a portion of the donor substrate is separated according to an exemplary embodiment.

FIG. 3 is a cross-sectional view illustrating a form of an exemplary image sensor after a portion of the donor substrate 100 is separated according to an exemplary embodiment.

When the donor substrate 100 and the metal interconnection layer 200 are attached, a thermal treatment process is performed on the donor substrate 100 for approximately 30 seconds to approximately 60 seconds at a temperature of approximately 800° C. to approximately 900° C. The thermal treatment may comprise a Rapid Thermal Annealing (RTA) process.

As shown in FIG. 3, by applying a simple physical force using the ion implantation layer 120 as a boundary, the donor substrate 100 below the ion implantation layer 120 is separated (e.g., by a process sometimes called "smart-cut").

For reference, vertical sequence of layers in the donor substrate 100 of FIGS. 2 and 3 is reversed from the donor substrate 100 of FIG. 1. Referring to FIG. 1, a region of the donor substrate 100 will be expressed.

Through these processes, a silicon single crystal layer used for a photodiode region of a CMOS image sensor is completed. Hereinafter, the portion (e.g., comprising layer 140) where the donor substrate 100 is attached to the metal interconnection layer 200 is called a photodiode layer.

Figure 4:
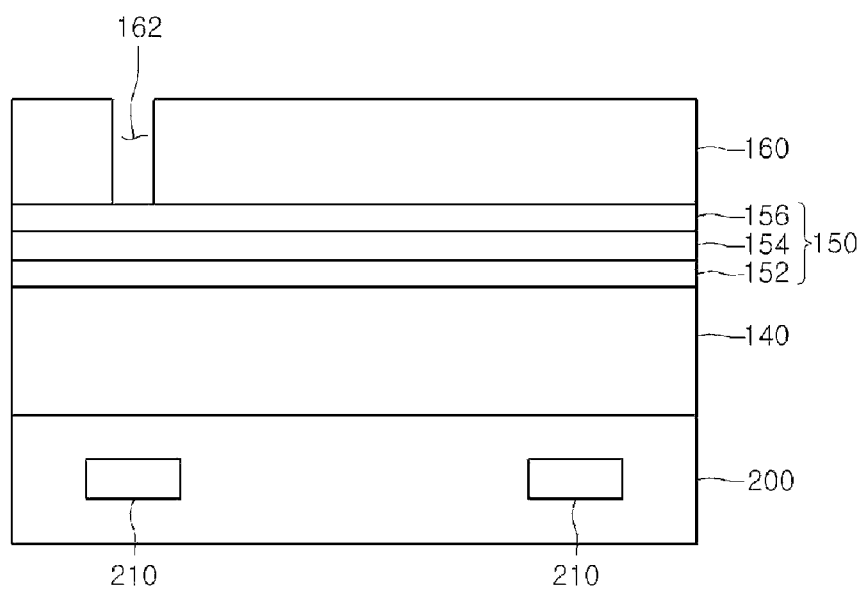
FIG. 4 is a cross-sectional view illustrating a form of an exemplary image sensor after a hard mask layer and a photoresist pattern are formed on the photodiode layer according to an exemplary embodiment.

FIG. 4 is a cross-sectional view illustrating a form of an exemplary image sensor after a hard mask layer 150 and a photoresist pattern 160 are formed on a photodiode layer 140 according to exemplary embodiments.

Next, a first oxide layer 152, a nitride layer 154, and a second oxide layer 156 are sequentially stacked on the photodiode layer 140 to form the hard mask layer 150. The first oxide layer 152 and the second oxide layer 156 may comprise a silicon oxide, for example one that may be formed from tetraethyl orthosilicate (TEOS), that is, $Si(C_2H_5O)_4$, and the nitride layer 154 may comprise or be formed of SiN. Alternatively, the hard mask layer 150 may comprise or consist essentially of a smaller number of insulator layers (e.g., oxide layer 152 and/or nitride layer 154).

Next, a photoresist material is applied on the hard mask layer 150 and then, reticle alignment, development, and exposure processes are performed to form the photoresist pattern 160 that defines a contact hole region 162 for contacting the metal interconnection 210 electrically.

Figure 5:
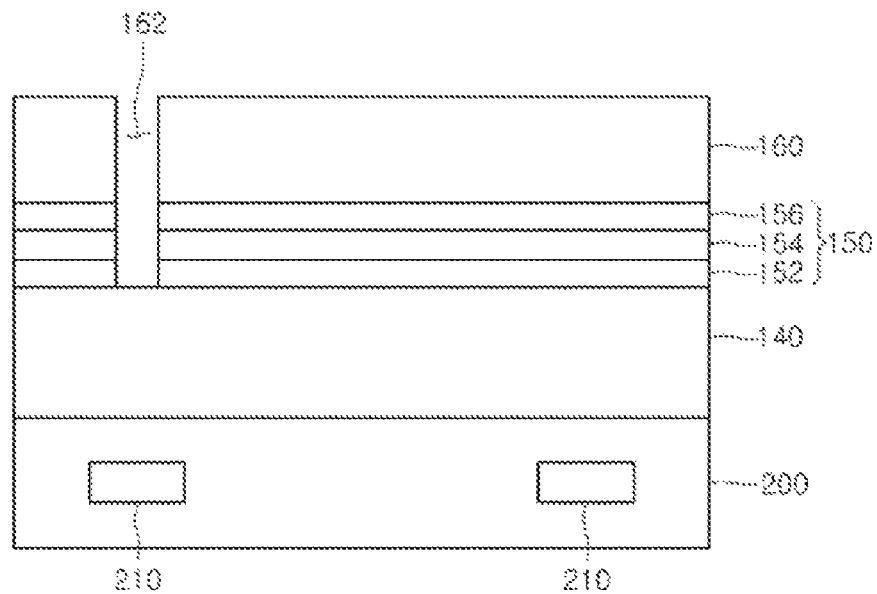
FIG. 5 is a cross-sectional view illustrating a form of an exemplary image sensor after the hard mask layer is etched according to an exemplary embodiment.

FIG. 5 is a cross-sectional view illustrating a form of an image sensor after the hard mask layer 150 is etched according to an embodiment.

Once the photoresist pattern 160 is formed, by using it as an etching mask, an etching process is performed to form a first trench, opening or hole 164 (hereinafter "hole") in the hard mask layer 150. At this point, the etching process may be performed using a dry etching process such as a Reactive Ion Etching (RIE) technique.

The hard mask layer 150 having the first hole 164 is used as an etching mask when a contact hole is subsequently formed in the photodiode layer 140 and the metal interconnection layer 200.

Figure 6:
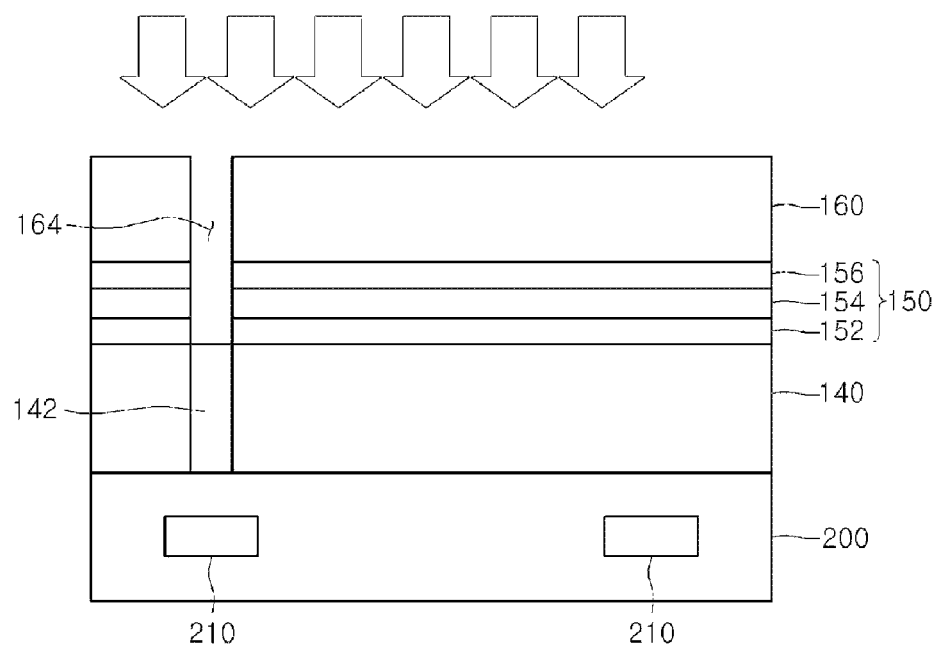
FIG. 6 is a cross-sectional view illustrating a form of an exemplary image sensor after an ion implantation etching layer is formed in the photodiode layer according to an exemplary embodiment.

FIG. 6 is a cross-sectional view illustrating a form of an exemplary image sensor after an ion implantation etching layer 142 is formed on the photodiode layer 140 according to one or more exemplary embodiment(s).

Next, an ion implantation process is performed using the photoresist pattern 160 as an ion injection mask. Alternatively, the photoresist pattern 160 may be removed, and the hard mask layer 150 having the first hole 164 therein may be used as an ion implantation mask.

Since the ions are implanted, an ion implantation etching layer 142 is formed in the photodiode layer 140, which corresponds vertically to the first hole 164. In one embodiment, hydrogen ions are uniformly implanted into a vertical region (e.g., an entire thickness) of the photodiode layer 140, and the defect distribution due to the ion implantation may also be relatively uniform in the ion implantation etching layer 142. Because of the uniform defect distribution, the ion implantation etching layer 142 has a faster etch rate than other parts or regions of the photodiode layer 140, and also compensates for effects or the unevenly-formed defect distribution from the ion implantation process performed to form the ion implantation layer 120 in the donor substrate 100. Accordingly, if a second hole is formed for a contact hole in the photodiode layer 140, etching is rapidly performed in the depth direction, such that a hole having a uniform shape can be formed.

Ion implantation conditions for forming the ion implantation etching layer 142 are as follows. A first condition includes using a small atomic weight ion (e.g., hydrogen, deuterium or helium ions). The ion for implantation is also generally one that does not significantly affect the electronic properties of the photodiode layer and/or hard mask. A second condition may include an ion implantation energy for smart-cut, which may correspond to an energy that is approximately 60% to approximately 80% of an energy supplied when the ion implantation layer 120 is formed. For example, if the thickness of the photodiode 140 is about 1.2 μm, a hydrogen ion can be implanted in a dose of approximately $1E^{16}$ atoms/cm$^2$ to approximately $1E^{17}$ atoms/cm$^2$ when an energy of about approximately 90 keV to approximately 120 keV is supplied.

Figure 7:
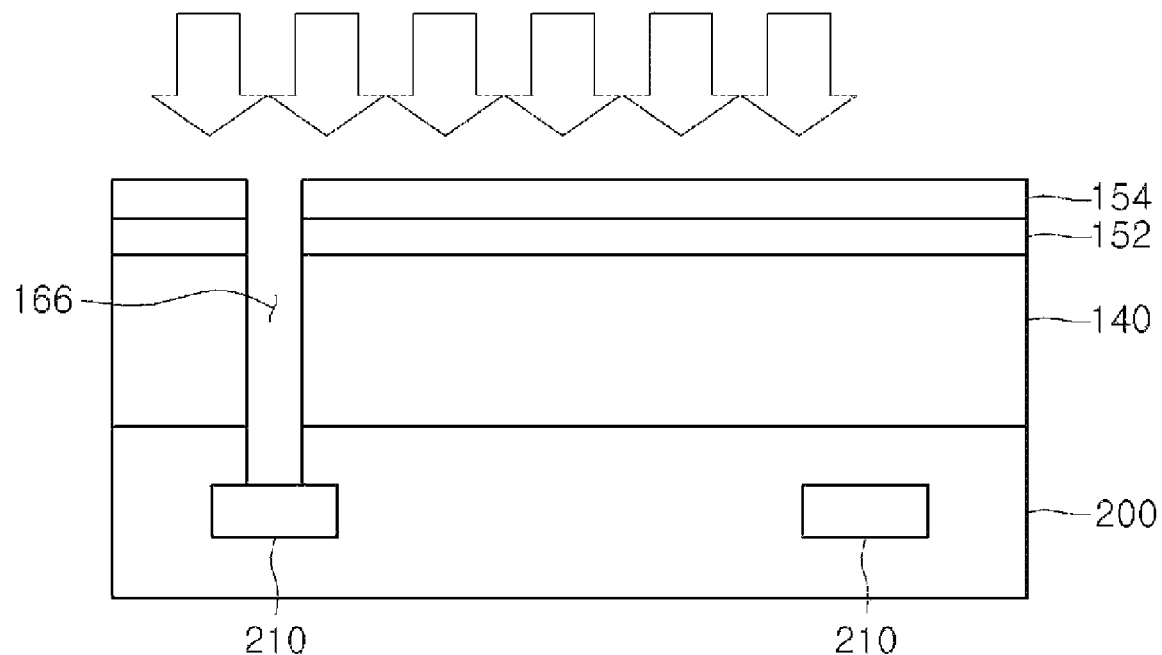
FIG. 7 is a cross-sectional view illustrating a form of an exemplary image sensor after a contact hole is formed according to an exemplary embodiment.

FIG. 7 is a cross-sectional view illustrating a form of an exemplary image sensor after a contact hole is formed according to one or more exemplary embodiments.

Once the ion implantation etching layer 142 is formed as mentioned above, the photoresist pattern 160 and the second oxide layer 156 are removed, and a first etching process is performed using the nitride layer as an etching mask. Alternatively, the photoresist pattern 160 may be removed prior to the first etching process, and the hard mask layer 150 having the first hole 164 therein may be used as an etching mask.

The first etching process is performed using a dry etching process, and a second hole is formed in the photodiode layer 140 by the first etching process.

Next, a third hole is formed in the metal interconnection layer 200 using a second etching process. In particular, one or more third holes are formed the insulating layer(s) in the metal interconnection layer 200 overlying corresponding metal interconnection(s) 210, thereby exposing an upper surface of metal interconnection(s) 210 to form a corresponding contact thereto. The second etching process also can be performed using a dry etching method. Accordingly, a contact hole 166 extends through the photodiode layer 140 and the insulating layer(s) in the metal interconnection layer 200, and exposes the metal interconnection 210. If necessary and/or desired, the first and second etching processes may be performed simultaneously.

Next, the remaining hard mask (e.g., nitride layer 154 and the oxide layer 152) are removed by wet or dry etching as described herein, and a metal material such as tungsten is filled in the contact hole 166 to form a contact. The tungsten may be deposited by chemical vapor deposition (CVD), and any tungsten deposited outside of the contact hole 166 may be removed by planarization (e.g., chemical mechanical polishing) or etchback. The contact may further comprise one or more liner and/or barrier layers between the tungsten plug and the insulating layer(s) (in a horizontal direction, as shown in FIG. 7) or the metal interconnection(s) 210 (in a vertical direction, as shown in FIG. 7), such as titanium (which may be deposited by sputtering), titanium nitride (which may be deposited by sputtering or CVD), or both (e.g., a titanium nitride-on-titanium bilayer).

The exemplary embodiments have the following effects.

First, in an image sensor having a structure in which a photodiode layer of a single crystal layer is on the uppermost surface after a metal interconnection layer is formed, a contact hole of a uniform size can be formed by overcoming an etch rate difference of the single crystal layer where ions are implanted to form a cutting plane.

Second, accordingly, when a tungsten deposition process is performed into the contact hole, the incidence of voids in the contact can be reduced or prevented. During a subsequent etching process for removing the etching mask, the tungsten contacts are generally not damaged, and the contact hole can be completely filled.

Third, accordingly, the operational reliability of an image sensor can be improved.

Any reference in this specification to "one embodiment," "an embodiment," "exemplary embodiment," etc., means that a particular feature, structure, or characteristic described in connection with the embodiment(s) is included in at least one embodiment of the invention. The appearances of such phrases in various places in the specification are not necessarily all referring to the same embodiment. Further, when a particular feature, structure, or characteristic is described in connection with any exemplary embodiment, it is within the purview of one skilled in the art to effect such feature, structure, or characteristic in connection with other ones of the embodiments.

Although the description has been made with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing an image sensor, the method comprising:

forming a photodiode layer on a metal interconnection layer having a metal interconnection therein, wherein forming the photodiode layer comprises forming an ion implantation layer in a first substrate by implanting ions therein, attaching the first substrate to a second substrate including the metal interconnection layer and separating the photodiode layer by cleaving the first substrate at the ion implantation layer or in a region between the ion implantation layer and a surface of the first substrate that is attached to the second substrate;

forming a hard mask layer on the photodiode layer, and forming a photoresist pattern on the hard mask layer to define a contact hole region;

forming a first hole in the hard mask layer through an etching process using the photoresist pattern as an etching mask;

forming an ion implantation etching layer inside the photodiode layer using the photoresist pattern as an ion implantation mask;

forming a second hole by etching the ion implantation etching layer; and forming a third hole to expose the metal interconnection by etching a region of the metal interconnection layer below the second hole.

2. The method according to claim 1, wherein the ions implanted into the first substrate comprise hydrogen ions.

3. The method according to claim 2, wherein forming the ion implantation layer comprises forming the ion implantation layer below a surface of the first substrate by controlling an injection energy and an injection dose of the hydrogen atoms.

4. The method according to claim 1, wherein:
forming the ion implantation layer further comprises forming a sacrificial oxide layer on the first substrate before the ions are implanted; and
attaching the first substrate to the metal interconnection layer further comprises removing the sacrificial oxide layer before the first substrate is attached.

5. The method according to claim 4, wherein forming the sacrificial oxide layer comprises a wet or a dry Rapid Thermal Oxidation (RTO) process.

6. The method according to claim 5, wherein removing the sacrificial oxide layer comprises a planarization process or an etching process.

7. The method according to claim 1, wherein:
the first substrate comprises a silicon single crystal layer; and
the second substrate comprises $SiO_2$.

8. The method according to claim 1, wherein forming the hard mask layer comprises sequentially forming a first oxide layer, a nitride layer, and a second oxide layer on the photodiode layer.

9. The method according to claim 8, wherein forming the second hole comprises:
removing the photoresist pattern after forming the first hole in the hard mask layer;
etching an exposed surface of the first oxide layer; and
etching the ion implantation etching layer using the nitride layer as an etching mask.

10. The method according to claim 1, wherein the first hole in the hard mask layer is formed through a dry etching process using Reactive Ion Etching (RIE).

11. The method according to claim 1, wherein forming the second hole comprises:
removing the photoresist pattern; and
etching the ion implantation etching layer using the hard mask layer having the first hole therein as an etching mask.

12. The method according to claim 1, wherein forming the ion implantation etching layer comprises conditions including a first condition comprising using hydrogen ions as impurity ions and a second condition comprising a second ion implantation energy that corresponds to 60% to 80% of a first ion implantation energy supplied when the ion implantation layer of the first substrate is formed.

13. The method according claim 1, wherein the second hole and the third hole are formed by a same etching process.

14. The method according to claim 1, wherein forming the second hole and forming the third hole comprise a dry etching process.

15. The method according to claim 1, further comprising:
removing the hard mask layer; and
forming a contact by filling the second hole and the third hole with a metal material.

16. The method according to claim 15, wherein the metal material comprises tungsten.

17. The method according to claim 1, wherein forming the second hole comprises etching the ion implantation etching layer using the photoresist pattern and/or the hard mask layer as an etching mask.

18. The method according to claim 1, further comprising separating the ion implantation layer from the first substrate by applying a physical force to the ion implantation layer using the ion implantation layer as a boundary.

19. The method according to claim 1, further comprising forming a contact in the contact hole region by forming a liner and/or a barrier layer in at least the second and third holes, and forming a tungsten plug on the liner and/or the barrier layer.

* * * * *